United States Patent
Togashi

(10) Patent No.: US 7,786,824 B2
(45) Date of Patent: Aug. 31, 2010

(54) MULTILAYER FILTER

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 70 days.

(21) Appl. No.: 11/822,509

(22) Filed: Jul. 6, 2007

(65) Prior Publication Data

US 2008/0055019 A1 Mar. 6, 2008

(30) Foreign Application Priority Data

Aug. 29, 2006 (JP) ............... 2006-232586

(51) Int. Cl.
*H03H 7/06* (2006.01)
(52) U.S. Cl. .................... 333/172; 333/185
(58) Field of Classification Search ........... 333/172, 333/185; 361/306.1, 306, 2, 307, 309, 311
See application file for complete search history.

(56) References Cited

U.S. PATENT DOCUMENTS

| 7,388,737 | B2 | 6/2008 | Togashi et al. | |
| 2002/0003281 | A1* | 1/2002 | Ibata et al. | 257/531 |
| 2006/0028303 | A1* | 2/2006 | Uchida et al. | 333/185 |

FOREIGN PATENT DOCUMENTS

| JP | A-06-275462 | 9/1994 |
| JP | A-07-161576 | 6/1995 |
| JP | A-08-195636 | 7/1996 |
| JP | A-10-097954 | 4/1998 |
| JP | A-11-054363 | 2/1999 |
| JP | A-11-103229 | 4/1999 |
| JP | A 2000-58382 | 2/2000 |
| JP | A-2003-151850 | 5/2003 |
| JP | A-2006-196685 | 7/2006 |

* cited by examiner

*Primary Examiner*—Robert Pascal
*Assistant Examiner*—Gerald Stevens
(74) *Attorney, Agent, or Firm*—Oliff & Berridge, PLC

(57) ABSTRACT

A multilayer filter has a capacitor element body, at least two signal terminal electrodes, and at least one grounding terminal electrode. The capacitor element body has a plurality of laminated insulator layers, a first signal internal electrode and a grounding internal electrode arranged to be opposed to each other with at least one insulator layer out of the plurality of insulator layers in between, and a second signal internal electrode arranged to be opposed to either one internal electrode of the first signal internal electrode and the grounding internal electrode with at least one insulator layer out of the plurality of insulator layers in between. The second signal internal electrode is connected to the at least two signal terminal electrodes. The first signal internal electrode is connected through a through-hole conductor to only the second signal internal electrode. The grounding internal electrode is connected to the at least one grounding terminal electrode.

2 Claims, 12 Drawing Sheets

MULTILAYER FILTER

BACKGROUND OF THE INVENTION

1. Field of the Invention

The present invention relates to a multilayer filter.

2. Related Background Art

One of the known multilayer filters is a multilayer filter having a laminate body consisting of a plurality of dielectric layers, an input electrode, an output electrode, and a ground electrode provided on the exterior of the laminate body, a resistor connected between the input electrode and the output electrode, first conductor electrodes separated portions of which are connected to the input electrode and the other separated portions of which are connected to the output electrode, and second conductor electrodes connected to the ground electrode, wherein a capacitance is generated between the first and second conductor electrodes. (For example, reference is made to Japanese Patent Application Laid-open No. 2000-58382.) The multilayer filter described in the Laid-open No. 2000-58382 is a so-called CR filter, in which the resistance of the resistor is adjusted by changing a compounding ratio of a dielectric powder in a resistive paste for formation of the resistor.

SUMMARY OF THE INVENTION

However, when the filter has the resistor and is adapted to adjust the resistance of the resistor by changing the compounding ratio of the dielectric powder in the resistive paste like the multilayer filter described in the Laid-open No. 2000-58382, it is extremely difficult to accurately control the resistance of the resistance component in the CR filter. In the case of the multilayer filter described in the Laid-open No. 2000-58382, it is particularly difficult to set the resistance of the resistance component to a large value.

An object of the present invention is to provide a multilayer filter capable of accurately controlling the resistance of the resistance component.

A multilayer filter according to the present invention is a multilayer filter comprising: a capacitor element body; at least two signal terminal electrodes placed on an exterior of the capacitor element body; and at least one grounding terminal electrode placed on the exterior of the capacitor element body; wherein the capacitor element body has a plurality of laminated insulator layers, a first signal internal electrode and a grounding internal electrode arranged so as to be opposed to each other with at least one insulator layer out of the plurality of insulator layers in between, and a second signal internal electrode arranged so as to be opposed to either one internal electrode of the first signal internal electrode and the grounding internal electrode with at least one insulator layer out of the plurality of insulator layers in between; wherein the second signal internal electrode is connected to the at least two signal terminal electrodes; wherein the first signal internal electrode is connected through a through-hole conductor to only the second signal internal electrode; and wherein the grounding internal electrode is connected to the at least one grounding terminal electrode.

In the multilayer filter according to the present invention, the signal internal electrodes include the second signal internal electrode connected to the signal terminal electrodes, and the first signal internal electrode connected indirectly only through the through-hole conductor to the signal terminal electrodes.

Incidentally, where all the signal internal electrodes are connected to the signal terminal electrodes, resistance components formed by the respective signal internal electrodes are connected in parallel to the signal terminal electrodes. For this reason, a combined resistance of the resistance components formed by the signal internal electrodes becomes smaller. The combined resistance will be further decreased if the lamination number of insulator layers and internal electrodes is increased in order to set the capacitance of the multilayer filter to a larger value.

The Inventors conducted elaborate research on the multilayer filter capable of accurately controlling the resistance of the resistance component. As a result, the Inventors came to find the new fact that the combined resistance of the resistance components formed by the signal internal electrodes could be set to a desired value by connecting the signal internal electrodes through the through-hole conductor placed in the capacitor element body and changing the number of signal internal electrodes connected to the signal terminal electrodes. The Inventors also came to find the new fact that the combined resistance of the resistance components formed by the signal internal electrodes could also be set similarly to a desired value by connecting the signal internal electrodes through the through-hole conductor placed in the capacitor element body and changing the location of the signal internal electrode connected to the signal terminal electrodes. Particularly, where the number of signal internal electrodes connected to the signal terminal electrodes is set smaller than the total number of signal internal electrodes, i.e., where the filter has the signal internal electrode connected indirectly to the signal terminal electrodes through the through-hole conductor, it becomes feasible to adjust the combined resistance so as to increase.

For the above reason, the present invention permits accurate control on the resistance of the resistance component. Particularly, the present invention permits the capacitance to be set to a large value and also permits the resistance of the resistance component in the CR filter to be set to a large value.

Preferably, the second signal internal electrode is of a meander shape. In this case, the resistance of the second signal internal electrode becomes relatively large, whereby the resistance of the resistance component in the CR filter can be set to a much larger value.

Another multilayer filter according to the present invention is a multilayer filter comprising a capacitor element body in which a plurality of dielectric layers and a plurality of internal electrodes are alternately laminated, and a plurality of terminal electrodes placed on an exterior of the capacitor element body, wherein the plurality of internal electrodes include a plurality of signal internal electrodes, and at least one grounding internal electrode; wherein the plurality of terminal electrodes include at least two signal terminal electrodes, and at least one grounding terminal electrode; wherein at least one signal internal electrode out of the plurality of signal internal electrodes is arranged to be opposed to the at least one grounding internal electrode with at least one insulator layer out of the plurality of insulator layers in between; wherein the at least one grounding internal electrode is connected to the at least one grounding terminal electrode; wherein the plurality of signal internal electrodes are connected to each other through a through-hole conductor; and wherein a signal internal electrode or signal internal electrodes as many as at least one out of the plurality of signal internal electrodes and at most a number one smaller than a total number of the signal internal electrodes are connected to the at least two signal terminal electrodes.

In the multilayer filter according to the present invention, the plurality of signal internal electrodes include the signal internal electrode(s) connected to the signal terminal electrodes, and the signal internal electrode(s) connected indirectly only through the through-hole conductor to the signal terminal electrodes. Therefore, as described above, the resistance of the resistance component can be accurately controlled. In the present invention, particularly, the capacitance can be set to a large value and the resistance of the resistance component in the CR filter can also be set to a large value.

Preferably, the signal internal electrode or signal internal electrodes connected to the at least two signal terminal electrodes out of the plurality of signal internal electrodes are of a meander shape. In this case, the resistance of the signal internal electrode(s) connected to the at least two signal terminal electrodes becomes relatively large, and the resistance of the resistance component in the CR filter can be set to a much larger value.

The present invention successfully provides the multilayer filter capable of accurately controlling the resistance of the resistance component.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. The same elements or elements with the same functionality will be denoted by the same reference symbols throughout the description, without redundant description.

Figure 1:
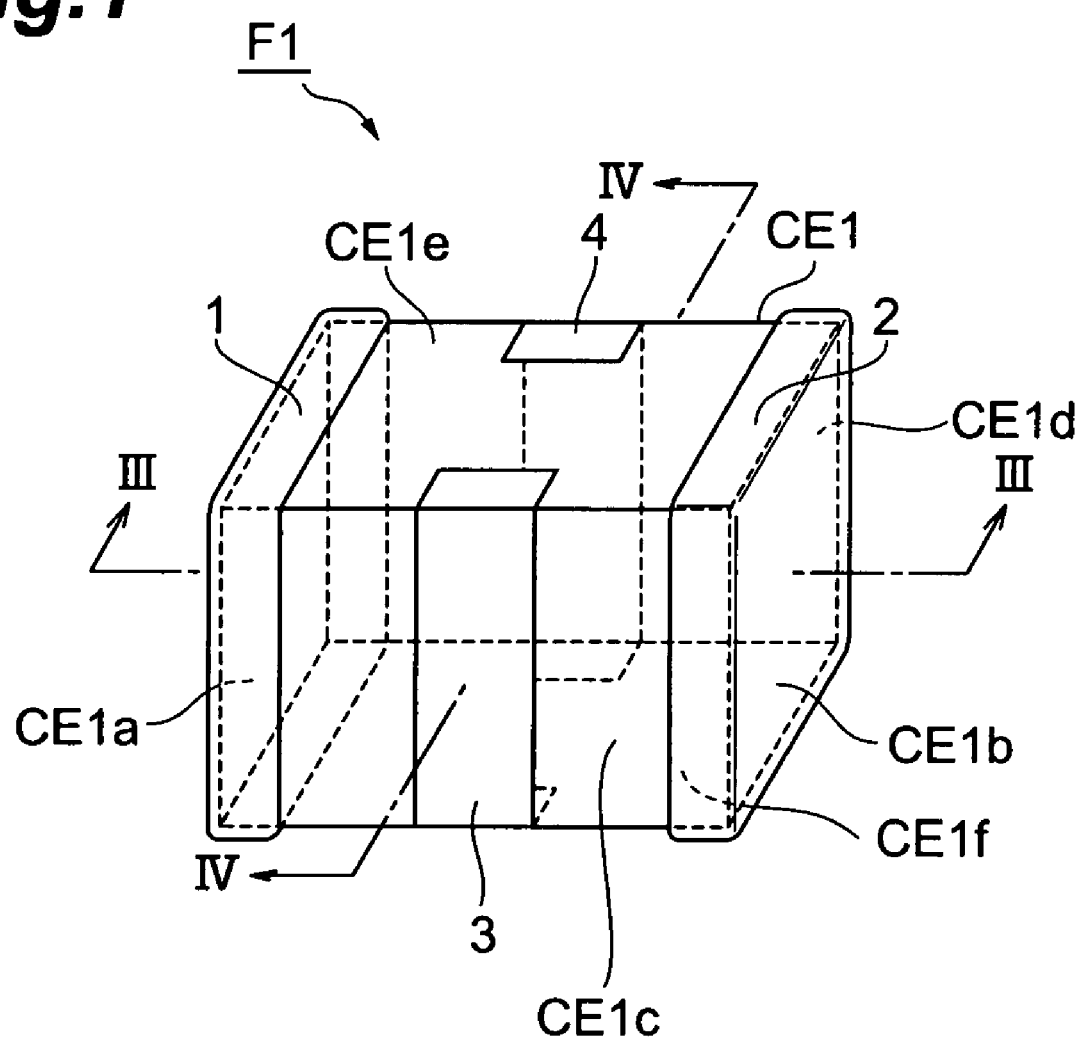
FIG. 1 is a perspective view of a multilayer filter according to an embodiment of the present invention.
Figure 2:
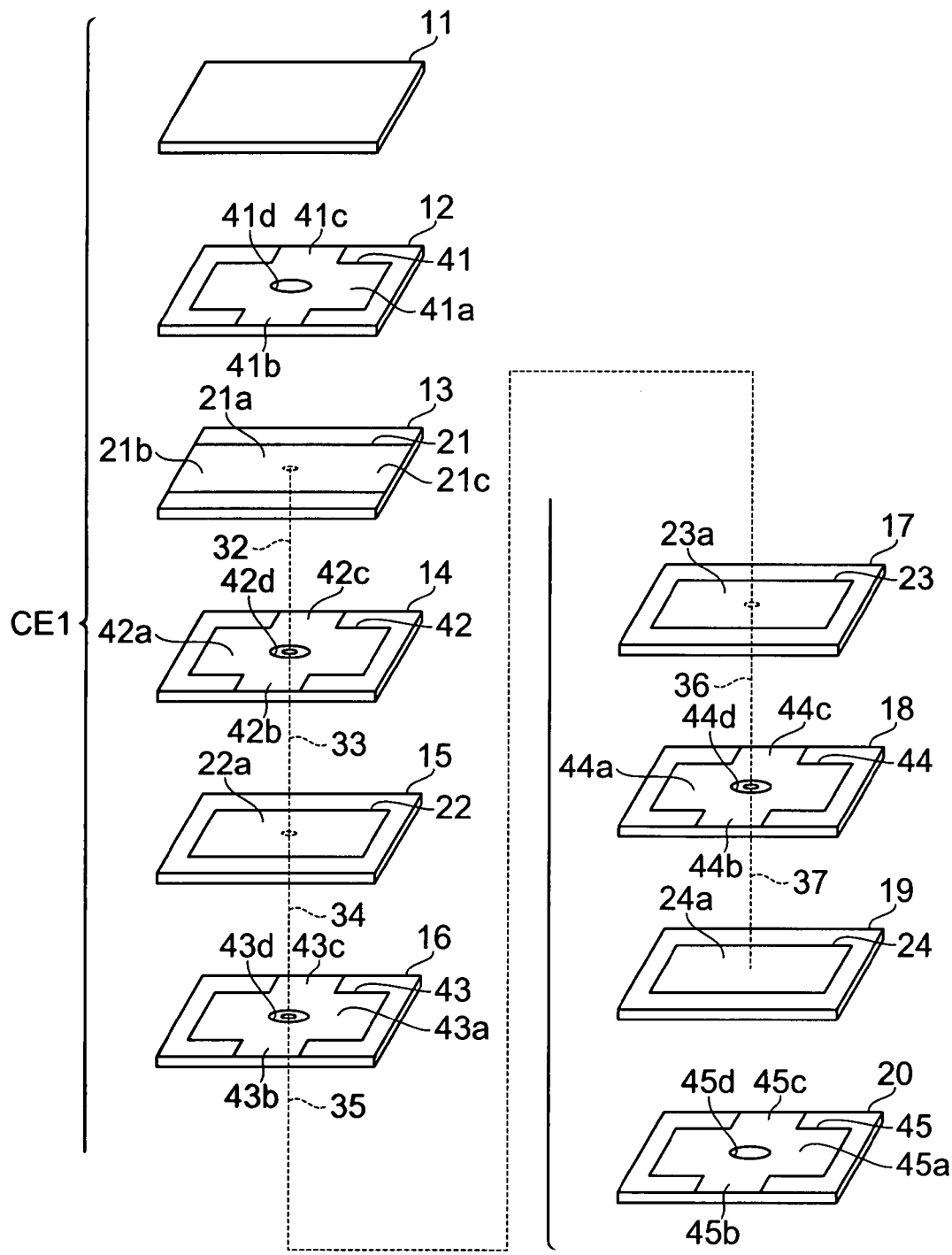
FIG. 2 is an exploded perspective view of a capacitor element body included in the multilayer filter of the embodiment.
Figure 3:
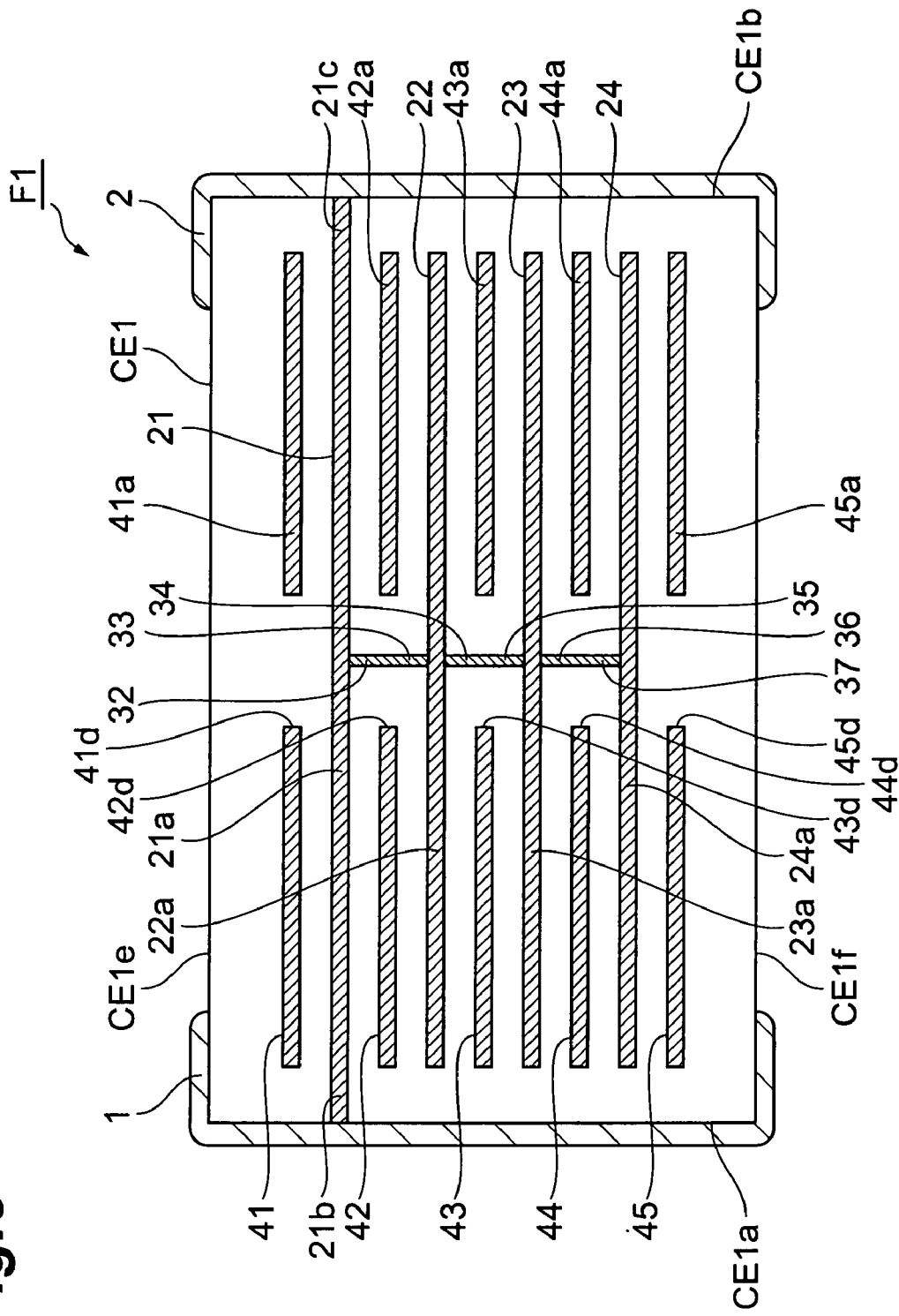
FIG. 3 is a schematic view showing a sectional configuration along line III-III in FIG. 1.
Figure 4:
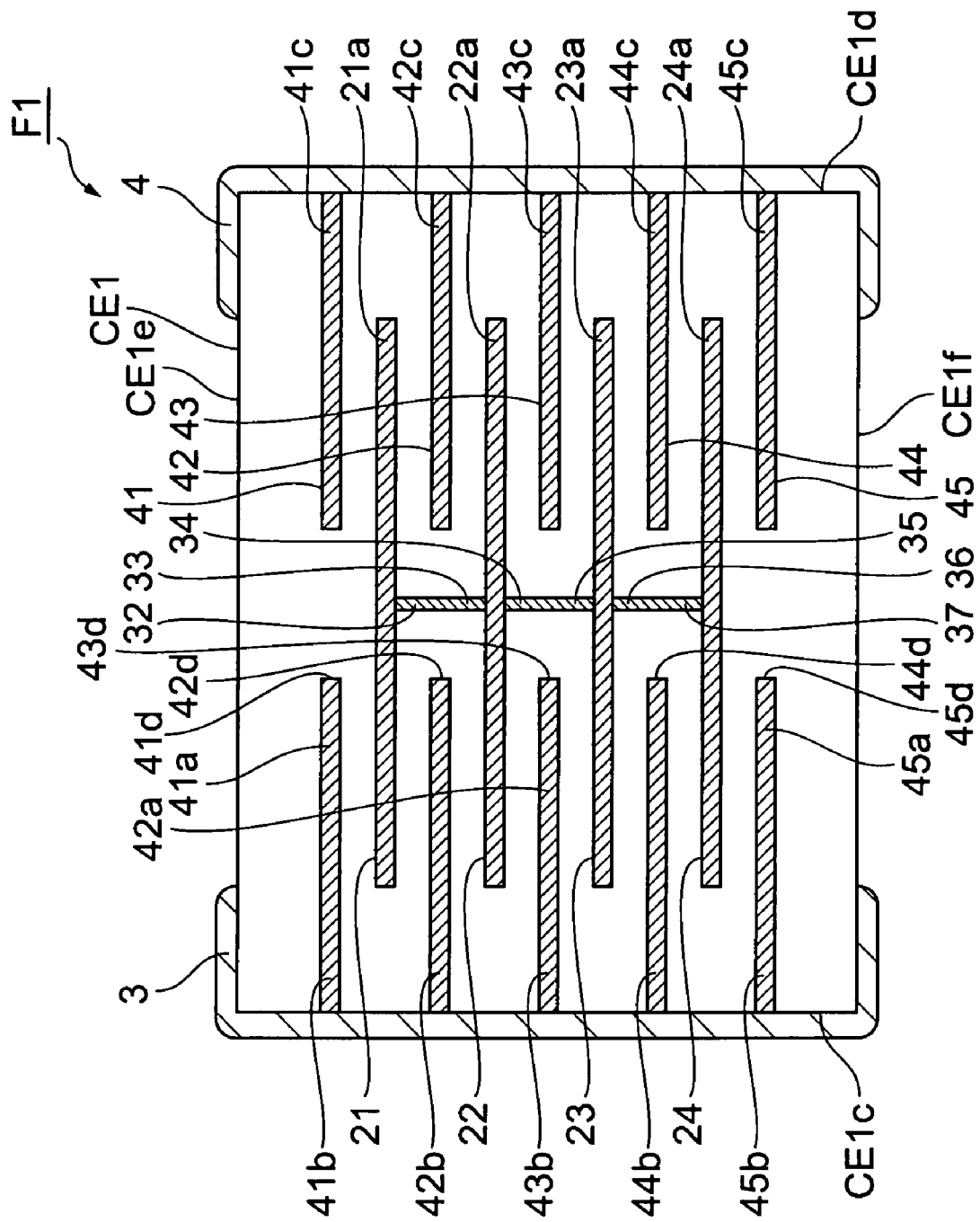
FIG. 4 is a schematic view showing a sectional configuration along line IV-IV in FIG. 1.

A configuration of a multilayer filter F1 according to an embodiment of the present invention will be described with reference to FIGS. 1 to 4. FIG. 1 is a perspective view of the multilayer filter according to the present embodiment. FIG. 2 is an exploded perspective view of a capacitor element body included in the multilayer filter according to the present embodiment. FIG. 3 is a schematic view showing a sectional configuration along line III-III in FIG. 1. FIG. 4 is a schematic view showing a sectional configuration along line IV-IV in FIG. 1.

The multilayer filter F1, as shown in FIG. 1, has a capacitor element body CE1, signal terminal electrodes 1, 2, and grounding terminal electrodes 3, 4. The signal terminal electrodes 1, 2 and grounding terminal electrodes 3, 4 are placed on the exterior of the capacitor element body CE1. The multilayer filter F1 is applicable, for example, as a noise filter for preventing leakage or intrusion of noise through wires for signals and others.

The capacitor element body CE1, as shown in FIG. 1, is of a rectangular parallelepiped shape and has first and second principal faces CE1e, CE1f, first and second end faces CE1a, CE1b, and first and second side faces CE1c, CE1d. The first and second principal faces CE1e, CE1f are rectangular and opposed to each other. The first and second end faces CE1a, CE1b extend in the shorter-side direction of the first and second principal faces so as to connect the first and second principal faces CE1e, CE1f, and are opposed to each other. The first and second side faces CE1c, CE1d extend in the longer-side direction of the first and second principal faces CE1e, CE1f so as to connect the first and second principal faces CE1e, CE1f, and are opposed to each other.

The signal terminal electrode 1 is disposed on the first end face CE1a of the capacitor element body CE1. The signal terminal electrode 1 is formed so as to cover the first end face CE1a and up onto the first and second principal faces CE1e, CE1f. The signal terminal electrode 2 is disposed on the second end face CE1b of the capacitor element body CE1. The signal terminal electrode 2 is formed so as to cover the second end face CE1b and up onto the first and second principal faces CE1e, CE1f. The signal terminal electrode 1 and the signal terminal electrode 2 are opposed to each other in the opposing direction of the first end face CE1a and the second end face CE1b.

The grounding terminal electrode 3 is disposed on the first side face CE1c of the capacitor element body CE1. The grounding terminal electrode 3 is formed so as to cover a portion of the first side face CE1c and up onto the first and second principal faces CE1e, CE1f. The grounding terminal electrode 4 is disposed on the second side face CE1d of the capacitor element body CE1. The grounding terminal electrode 4 is formed so as to cover a portion of the second side face CE1d and up onto the first and second principal faces CE1e, CE1f. The grounding terminal electrode 3 and the grounding terminal electrode 4 are opposed to each other in the opposing direction of the first side face CE1c and the second side face CE1d.

The signal terminal electrodes 1, 2 and the grounding terminal electrodes 3, 4 are formed, for example, by applying an electroconductive paste containing an electroconductive metal powder and glass frit, onto the exterior of the capacitor element body CE1, and baking it. A plated layer may be formed on the baked terminal electrodes according to need. These signal terminal electrodes 1, 2 and grounding terminal electrodes 3, 4 are formed as being electrically isolated from each other on the surface of the capacitor element body CE1.

The capacitor element body CE1, as shown in FIG. 2, has a plurality of insulator layers 11-20 (ten layers in the present embodiment), and a plurality of internal electrodes 21-24, 41-45 (nine layers in the present embodiment). Each of the insulator layers 11-20 extends in the direction parallel to the first and second principal faces CE1e, CE1f and they are laminated in the opposing direction of the first and second principal faces CE1e, CE1f. Each insulator layer 11-20 is comprised, for example, of a sintered body of a ceramic green sheet containing a dielectric ceramic. In a practical multilayer filter F1, the insulator layers 11-20 are integrally formed so that no boundary can be visually recognized between them.

The plurality of internal electrodes 21-24, 41-45 include a plurality of signal internal electrodes 21-24 (four layers in the present embodiment) and a plurality of grounding internal electrodes 41-45 (five layers in the present embodiment). The signal internal electrodes 21-24 include first signal internal electrodes 22-24 and a second signal internal electrode 21. Each of the internal electrodes 21-24, 41-45 is comprised, for example, of a sintered body of an electroconductive paste.

A first signal internal electrode 22-24 and a grounding internal electrode 42-45 are arranged so as to be opposed to each other with one insulator layer 14-19 in between. Namely, the first signal internal electrode 22 and the grounding internal electrode 42 are opposed to each other with the insulator layer 14 in between. The first signal internal electrode 22 and the grounding internal electrode 43 are opposed to each other with the insulator layer 15 in between. The first signal internal electrode 23 and the grounding internal electrode 43 are opposed to each other with the insulator layer 16 in between. The first signal internal electrode 23 and the grounding internal electrode 44 are opposed to each other with the insulator layer 17 in between. The first signal internal electrode 24 and the grounding internal electrode 44 are opposed to each other with the insulator layer 18 in between. The first signal internal electrode 24 and the grounding internal electrode 45 are opposed to each other with the insulator layer 19 in between.

A grounding internal electrode 41-45 includes a main electrode portion 41a-45a, and lead portions 41b-45b, 41c-45c. The main electrode portion 41a-45a is of a rectangular shape whose longer sides extend along the longer-side direction of the first and second principal faces CE1e, CE1f. The main electrode portion 41a-45a and the lead portions 41b-45b, 41c-45c are integrally formed. An opening 41d-45d is formed in the main electrode portion 41a-45a so as to expose the insulator layer 12, 14, 16, 18, 20.

The lead portion 41b-45b extends from the central part in the longer-side direction of the main electrode portion 41a-45a toward the first side face CE1c and is led out to the first side face CE1c. The lead portion 41c-45c extends from the central part in the longer-side direction of the main electrode portion 41a-45a toward the second side face CE1d and is led out to the second side face CE1d.

The lead portion 41b-45b is electrically and physically connected to the grounding terminal electrode 3. The lead portion 41c-45c is electrically and physically connected to the grounding terminal electrode 4. These cause the grounding internal electrodes 41-45 to be electrically and physically connected to the grounding terminal electrodes 3, 4.

A first signal internal electrode 22-24 includes a main electrode portion 22a-24a. The main electrode portion 22a-24a is of a rectangular shape whose longer sides extend along the longer-side direction of the first and second principal faces CE1e, CE1f.

The second signal internal electrode 21 includes a main electrode portion 21a, and lead portions 21b, 21c. The main electrode portion 21a is of a rectangular shape whose longer sides extend along the longer-side direction of the first and second principal faces CE1e, CE1f. The main electrode portion 21a and the lead portions 21b, 21c are integrally formed. Widths of the lead portions 21b, 21c (lengths in the opposing direction of the first side face CE1c and the second side face CE1d) are set to the same as the width of the main electrode portion 21a (likewise, the length in the opposing direction of the first side face CE1c and the second side face CE1d).

The lead portion 21b extends from the edge on the first end face CE1a side of the main electrode portion 21a toward the first end face CE1a and is led out to the first end face CE1a. The lead portion 21c extends from the edge on the second end face CE1b side of the main electrode portion 21a toward the second end face CE1b and is led out to the second end face CE1b. The lead portion 21b is electrically and physically connected to the signal terminal electrode 1. The lead portion 21c is electrically and physically connected to the signal terminal electrode 2.

The second signal internal electrode 21 is arranged to be opposed to the grounding internal electrode 41 with one insulator layer 12 in between, and to be opposed to the grounding internal electrode 42 with one insulator layer 13 in between.

A through-hole conductor 32 penetrating the insulator layer 13 in the thickness direction is formed at the position corresponding to the openings 41d, 42d formed in the main electrode portions 41a, 42a of the grounding internal electrodes 41, 42, in the insulator layer 13. The through-hole conductor 32 is located corresponding to the approximate center of the openings 41d, 42d and is electrically and physically connected to the second signal internal electrode 21.

A through-hole conductor 33 penetrating the insulator layer 14 in the thickness direction is formed at the position corresponding to the opening 42d formed in the main electrode portion 42a of the grounding internal electrode 42, in the insulator layer 14. The through-hole conductor 33 is located approximately in the center of the opening 42d.

A through-hole conductor 34 penetrating the insulator layer 15 in the thickness direction is formed at the position corresponding to the openings 42d, 43d formed in the main electrode portions 42a, 43a of the grounding internal electrodes 42, 43, in the insulator layer 15. The through-hole conductor 34 is located corresponding to the approximate center of the openings 42d, 43d and is electrically and physically connected to the first signal internal electrode 22.

A through-hole conductor 35 penetrating the insulator layer 16 in the thickness direction is formed at the position corresponding to the opening 43d formed in the main electrode portion 43a of the grounding internal electrode 43, in the insulator layer 16. The through-hole conductor 35 is located approximately in the center of the opening 43d.

A through-hole conductor 36 penetrating the insulator layer 17 in the thickness direction is formed at the position corresponding to the openings 43d, 44d formed in the main electrode portions 43a, 44a of the grounding internal electrodes 43, 44, in the insulator layer 17. The through-hole conductor 36 is located corresponding to the approximate center of the openings 43d, 44d and is electrically and physically connected to the first signal internal electrode 23.

A through-hole conductor 37 penetrating the insulator layer 18 in the thickness direction is formed at the position corresponding to the opening 44d formed in the main electrode portion 44a of the grounding internal electrode 44, in the insulator layer 18. The through-hole conductor 37 is located approximately in the center of the opening 44d.

The through-hole conductor 32 is electrically and physically connected to the through-hole conductor 33 in a state in which the insulator layer 13 and the insulator layer 14 are laminated. The through-hole conductor 33 is electrically and physically connected to the first signal internal electrode 22 in a state in which the insulator layer 14 and the insulator layer 15 are laminated. The through-hole conductor 34 is electrically and physically connected to the through-hole conductor 35 in a state in which the insulator layer 15 and the insulator layer 16 are laminated. The through-hole conductor 35 is electrically and physically connected to the first signal internal electrode 23 in a state in which the insulator layer 16 and the insulator layer 17 are laminated. The through-hole conductor 36 is electrically and physically connected to the through-hole conductor 37 in a state in which the insulator layer 17 and the insulator layer 18 are laminated. The through-hole conductor 37 is electrically and physically connected to the first signal internal electrode 24 in a state in which the insulator layer 18 and the insulator layer 19 are laminated.

When the insulator layers 11-20 are laminated, as shown in FIGS. 3 and 4, the through-hole conductors 32-37 are arranged side by side approximately linearly in the lamination direction to be electrically connected to each other to constitute an electric path. Namely, the first signal internal electrodes 22-24 are electrically connected to the second signal internal electrode 21 through the through-hole conductors 32-37. It is noted that in FIGS. 3 and 4, hatching for the regions corresponding to the insulator layers 11-20 is omitted for better understanding of the drawings.

The main electrode portions 22a-24a of the first signal internal electrodes 22-24 and the main electrode portions 42a-45a of the grounding internal electrodes 42-45 are arranged so that their corresponding main electrode portions are opposed to each other with the insulator layer 14-19 in between. This results in forming a capacitance component having a predetermined capacitance. In the present embodiment, the main electrode portion 21a of the second signal internal electrode 21 and the main electrode portions 41a, 42a of the grounding internal electrodes 41, 42 are also opposed to each other with the insulator layer 12, 13 in between, thereby forming a capacitance component.

Figure 5:
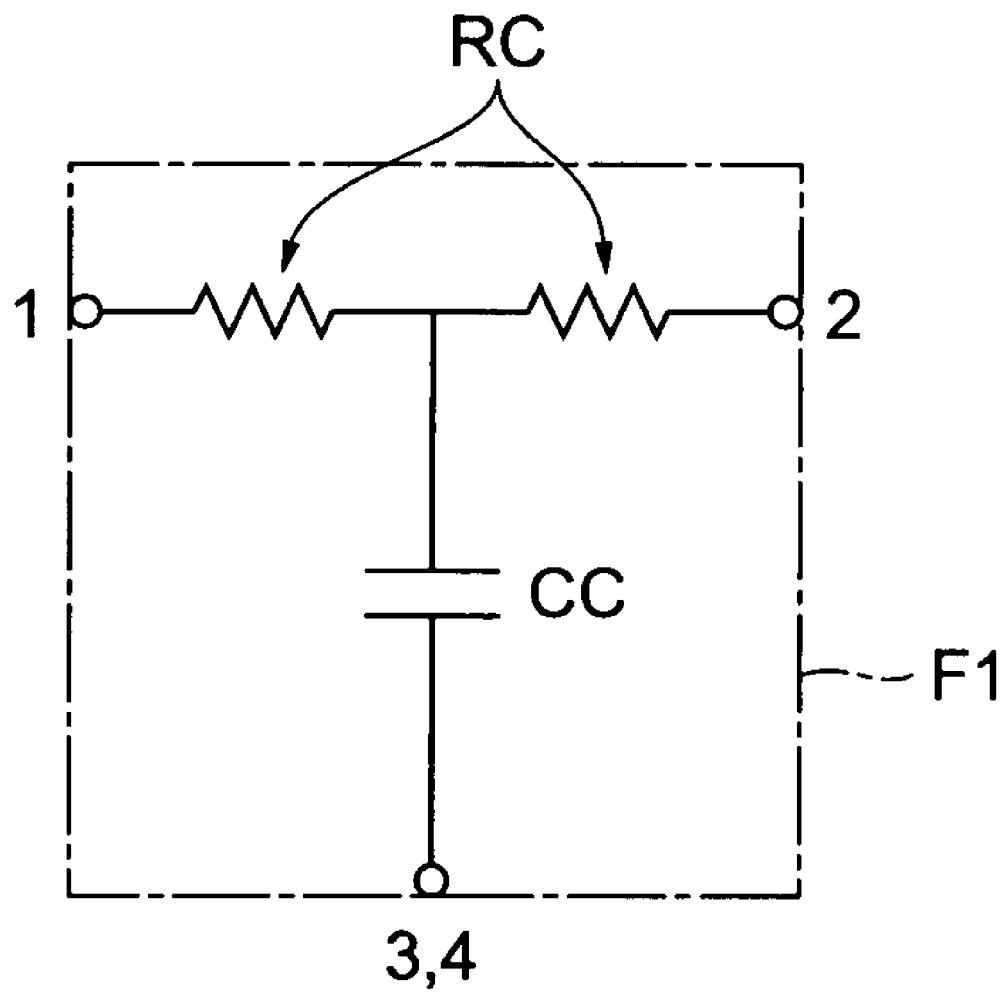
FIG. 5 is an equivalent circuit diagram of the multilayer filter of the embodiment.

In the multilayer filter F1 constructed as described above, a capacitance component CC and a resistance component RC are formed as shown in FIG. 5. In this case, the signal terminal electrodes 1, 2 are connected to signal conductors and the grounding terminal electrodes 3, 4 are connected to a ground connection conductor. FIG. 5 is an equivalent circuit diagram of the multilayer filter according to the present embodiment.

The capacitance component CC is composed, as described above, of the insulator layers 12-19, and the signal internal electrodes 21-24 and the grounding internal electrodes 41-45 opposed to each other with the insulator layer 12-19 in between. The resistance component RC is composed of the signal internal electrodes 21-24 and the through-hole conductors 32-37. Therefore, the resistance component RC is connected in series between the signal terminal electrode 1 and the signal terminal electrode 2.

Incidentally, in the multilayer filter F1, all the signal internal electrodes 21-24 are not connected directly to the terminal electrodes, only at least one of the signal internal electrodes (second signal internal electrode 21) is directly connected to the signal terminal electrodes 1, 2, and the remaining signal internal electrodes (first signal internal electrodes 22-24) are connected indirectly to the signal terminal electrodes 1, 2 through the through-hole conductors 32-37 and the second signal internal electrode 21. Namely, in the multilayer filter F1, the plurality of signal internal electrodes 21-24 are connected to each other through the through-hole conductors 32-37, and the signal internal electrode or signal internal electrodes as many as at least one of the plurality of signal internal electrodes 21-24 and at most a number one smaller than the total number of the signal internal electrodes 21-24 (one signal internal electrode 21 in the present embodiment) are connected to the signal terminal electrodes 1, 2.

In the multilayer filter F1, with focus on the signal terminal electrode 1, the respective resistance components of the through-hole conductors 32-37 are connected in series to the signal terminal electrode 1. With focus on the signal terminal electrode 2, the respective resistance components of the through-hole conductors 32-37 are connected in series to the signal terminal electrode 2.

For these reasons, the multilayer filter F1 comes to have the resistance of the resistance component RC larger than a multilayer filter having a configuration in which all the signal internal electrodes 21-24 are connected through their lead portions to the signal terminal electrodes 1, 2.

In the multilayer filter F1, the resistance of the resistance component RC varies when the number of signal internal electrodes connected directly to the signal terminal electrodes 1, 2 is changed in the range of at least one and at most the number one smaller than the total number of the signal internal electrodes 21-24. In the multilayer filter F1, when the location of the signal internal electrode connected directly to the signal terminal electrodes 1, 2 (the position in the lamination direction in the capacitor element body CE1) is changed, connection states of the resistance components of the through-hole conductors 32-37 (series connection or parallel connection) vary, so as to vary the resistance of the resistance component RC.

In the present embodiment, as described above, the resistance of the resistance component RC of the multilayer filter F1 is set to a desired value by adjusting either or both of the number and location of the second signal internal electrode 21 connected directly to the signal terminal electrodes 1, 2 through the lead portions 21b, 21c. This permits us to readily and accurately control the resistance of the resistance component RC.

In the present embodiment, it is feasible to prevent the resistance of the resistance component RC of the multilayer filter F1 from becoming small, even in a case where the capacitance of the capacitance component CC is increased with increase in the lamination number of first signal internal electrodes 22-24 and grounding internal electrodes 41-45 in order to adapt for increase in capacitance.

In the present embodiment, the signal terminal electrodes 1, 2 are opposed to each other in the opposing direction of the first and second end faces CE1a, CE1b of the capacitor element body CE1. The grounding terminal electrodes 3, 4 are opposed to each other in the opposing direction of the first and second side faces CE1c, CE1d of the capacitor element body CE1. These facilitate connection of the signal terminal electrodes 1, 2, for example, to linear signal conductors and also facilitate connection of the grounding terminal electrodes 3, 4 to a linear ground connection conductor. These result in facilitating mounting of the multilayer filter F1.

The above described the preferred embodiment of the present invention, but it is noted that the present invention is not always limited to the above-described embodiment but may be modified in various ways without departing from the scope and spirit of the invention.

Figure 6:
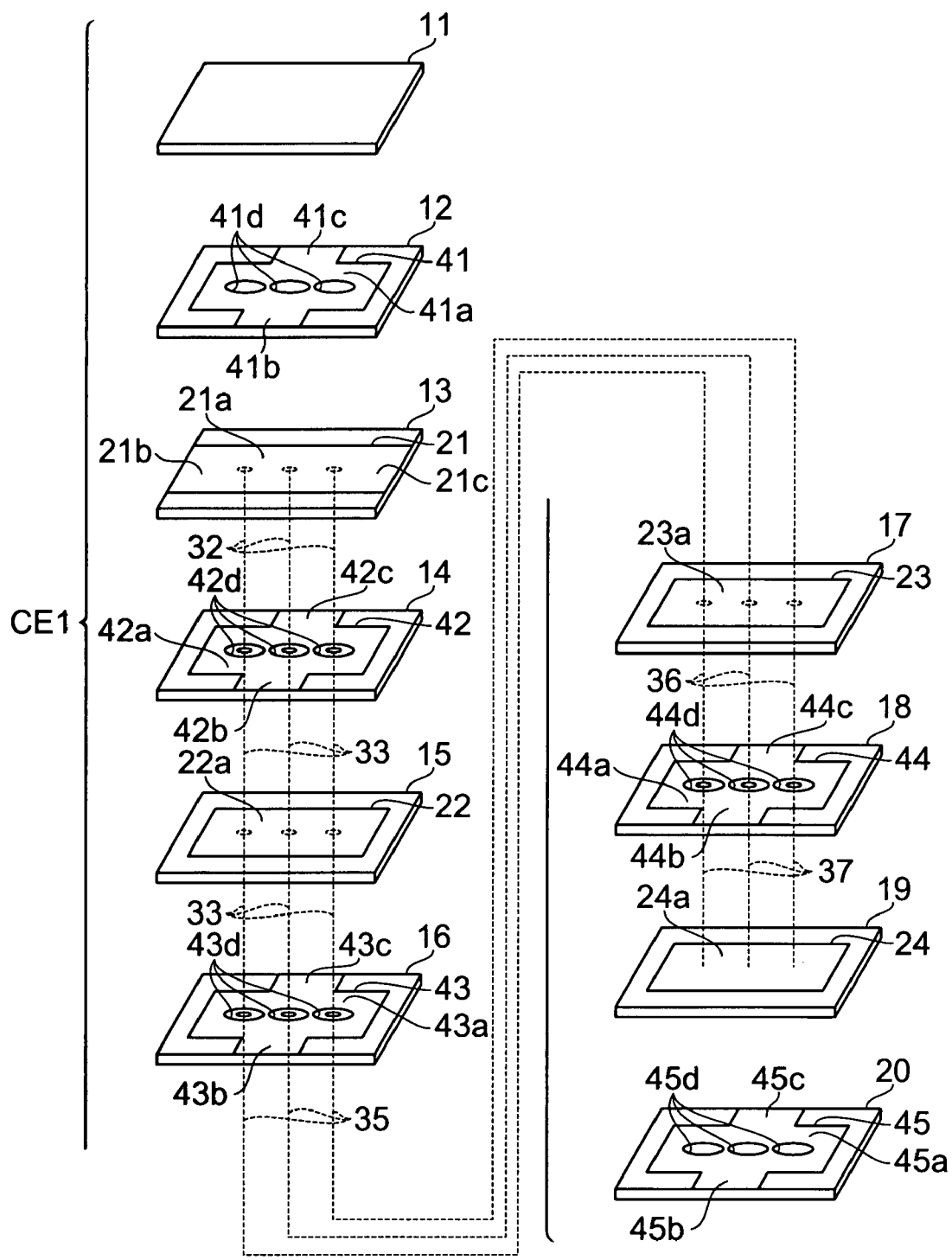
FIG. 6 is an exploded perspective view of a modification example of the capacitor element body included in the multilayer filter according to the embodiment.
Figure 7:
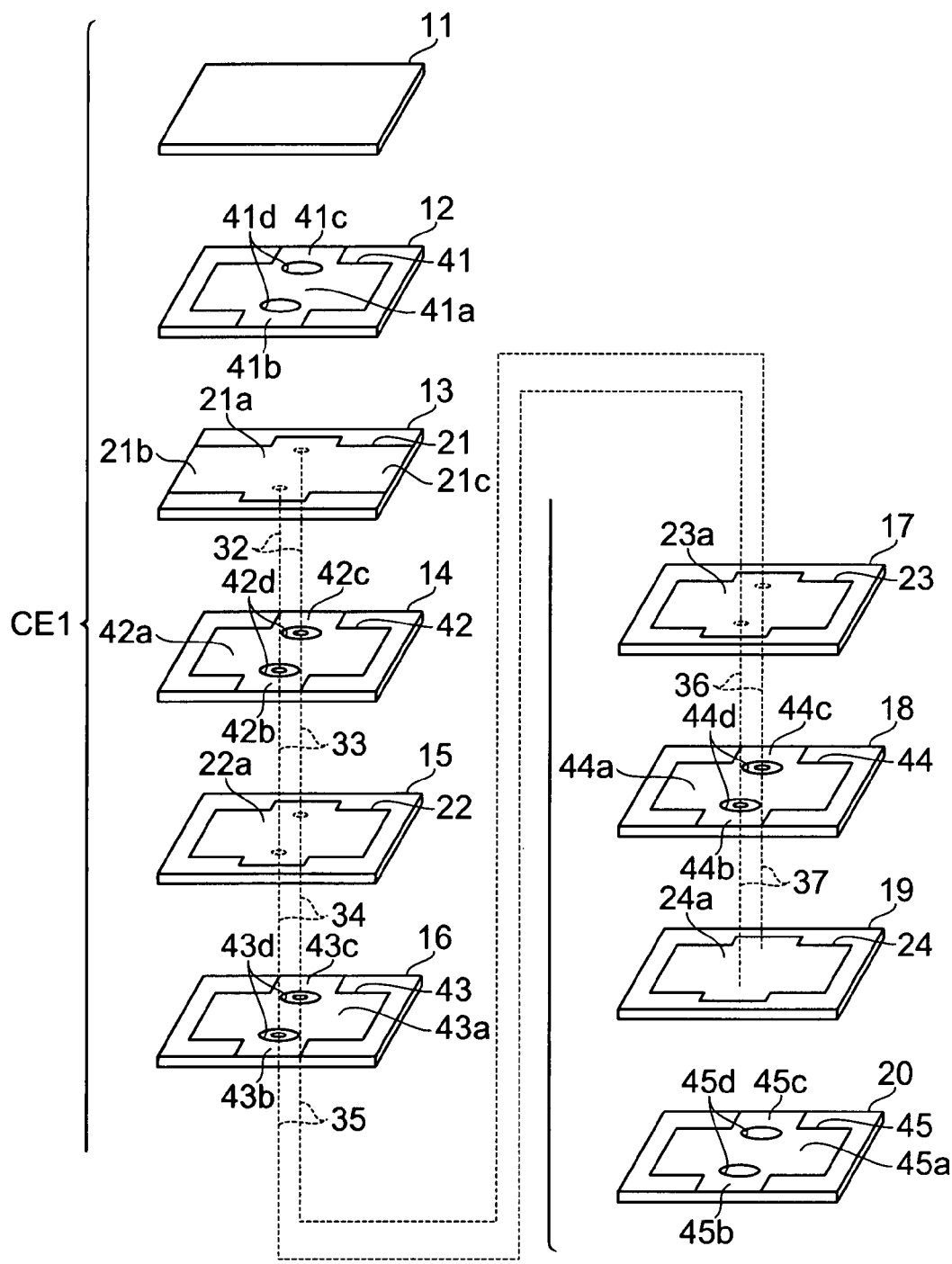
FIG. 7 is an exploded perspective view of another modification example of the capacitor element body included in the multilayer filter according to the embodiment.
Figure 8:
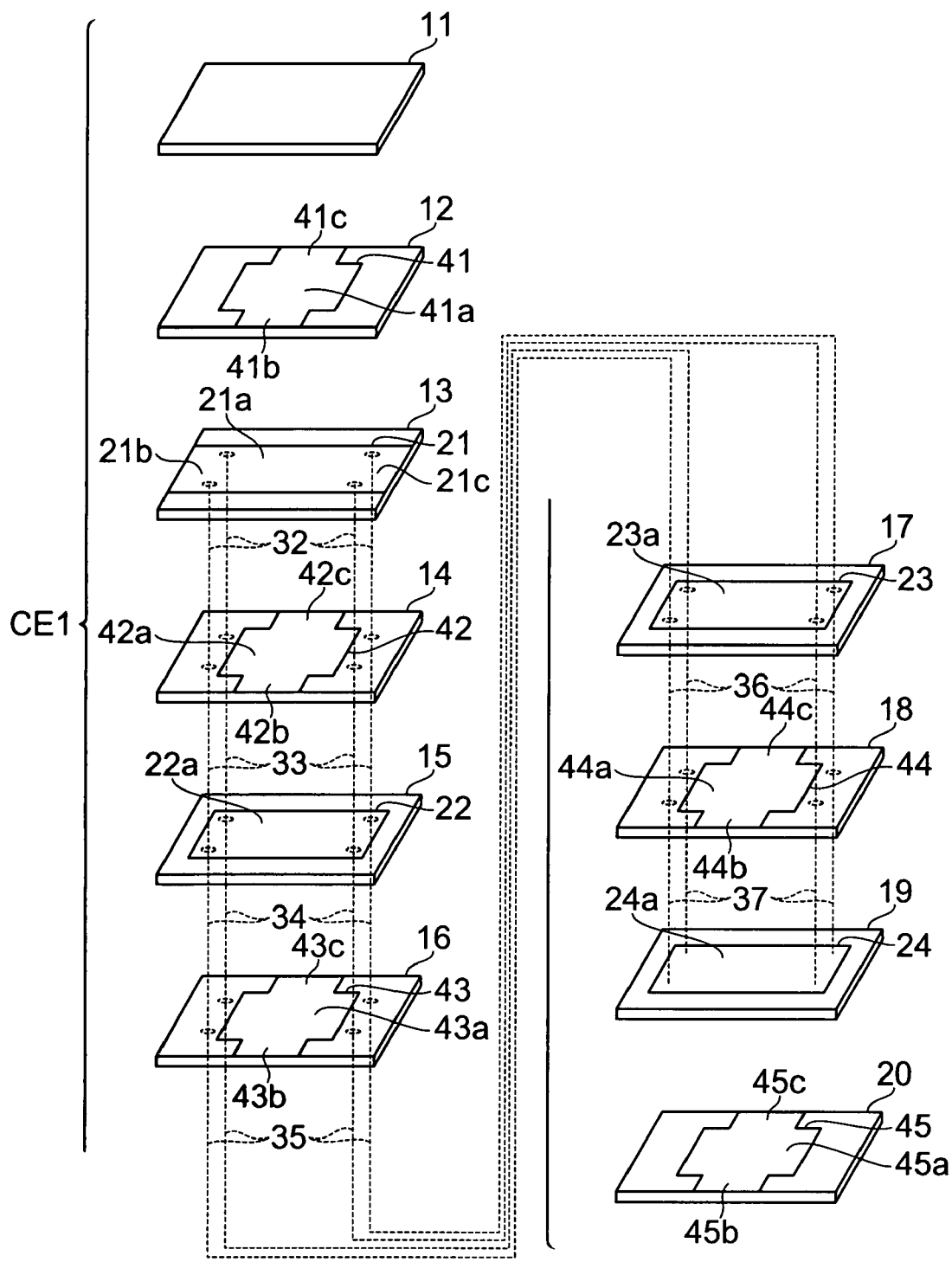
FIG. 8 is an exploded perspective view of still another modification example of the capacitor element body included in the multilayer filter according to the embodiment.

The resistance of the resistance component RC of the multilayer filter F1 may be set to a desired value by adjusting the number of through-hole conductors 32-37. In this case, it is feasible to more accurately control the resistance component RC of the multilayer filter F1. FIGS. 6 to 8 show examples of the adjustment of the number of through-hole conductors 32-37.

In the capacitor element body CE1 of the multilayer filter shown in FIG. 6, the numbers of through-hole conductors 32-37 in the multilayer filter F1 of the present embodiment are set each to 3, whereby the resistance of the resistance component RC is set to a desired value. Therefore, the signal internal electrodes 21-24 are electrically connected to each other through three electric paths.

In the capacitor element body CE1 of the multilayer filter shown in FIG. 7, the numbers of through-hole conductors 32-37 in the multilayer filter F1 of the present embodiment are set each to 2, whereby the resistance of the resistance component RC is set to a desired value. Therefore, the signal internal electrodes 21-24 are electrically connected to each other through two electric paths.

In the capacitor element body CE1 of the multilayer filter shown in FIG. 8, the numbers of through-hole conductors 32-37 in the multilayer filter F1 of the present embodiment are set each to 4, whereby the resistance of the resistance component RC is set to a desired value. Therefore, the signal internal electrodes 21-24 are electrically connected to each other through four electric paths.

Figure 9:
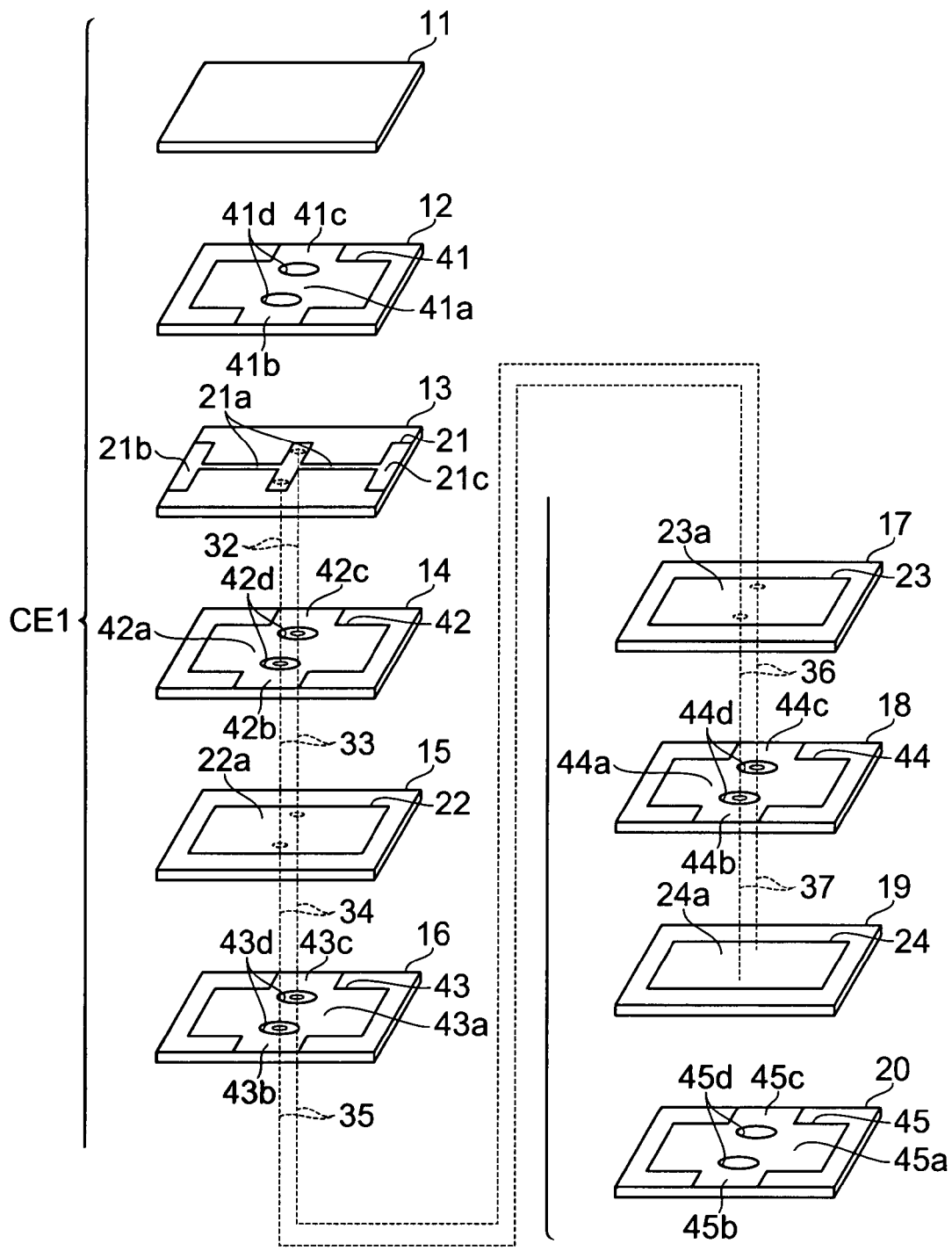
FIG. 9 is an exploded perspective view of still another modification example of the capacitor element body included in the multilayer filter according to the embodiment.
Figure 10:
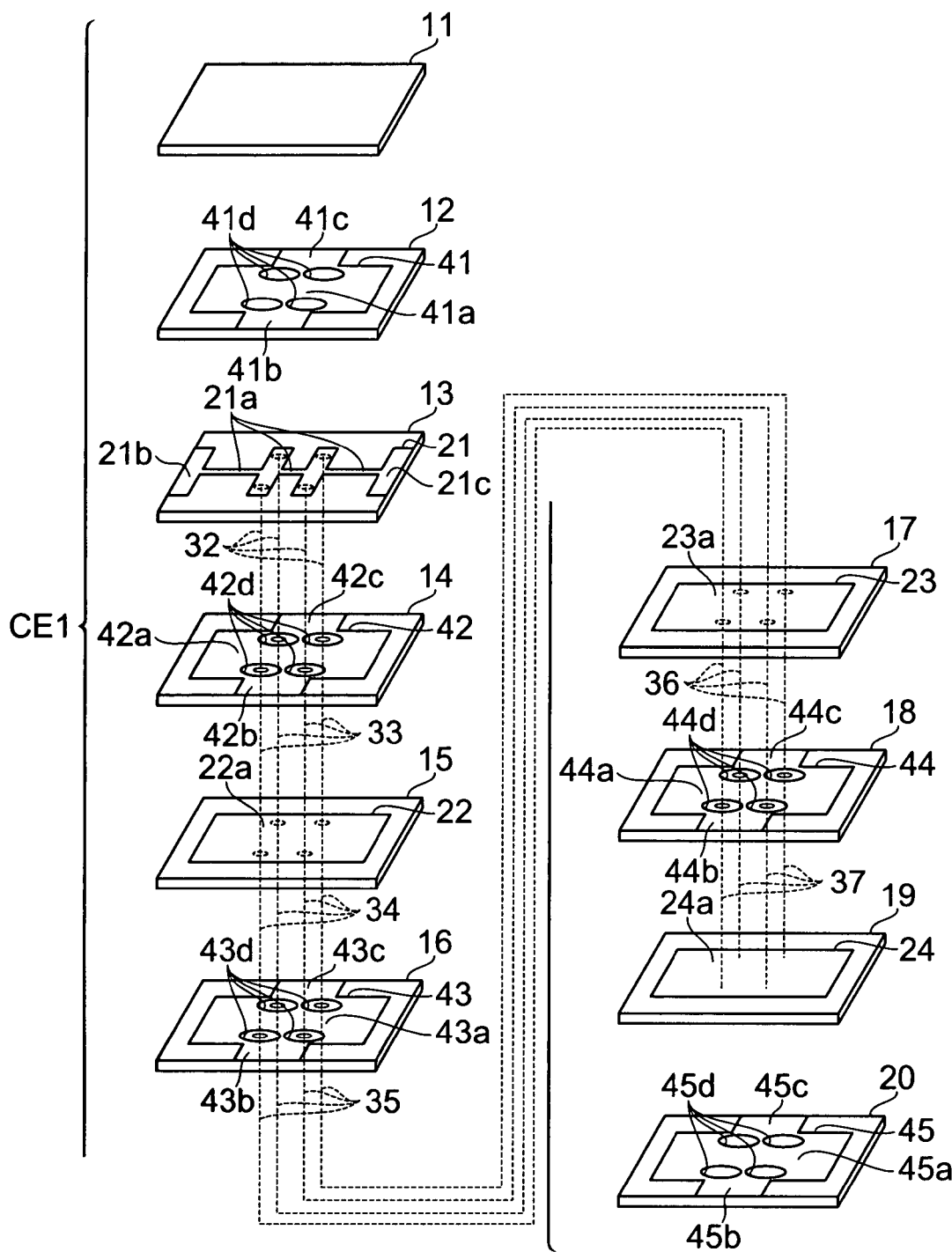
FIG. 10 is an exploded perspective view of still another modification example of the capacitor element body included in the multilayer filter according to the embodiment.

The shapes of the internal electrodes 21-24, 41-45 are not limited to those described in the above embodiment. As shown in FIGS. 9 and 10, the widths of the lead portions 21b, 21c of the second signal internal electrode 21 (lengths in the opposing direction of the first and second side faces CE1c, CE1d) may be different from the width of the main electrode portion 21a (likewise, the length in the opposing direction of the first and second side faces CE1c, CE1d). In the capacitor element bodies CE1 of the multilayer filters shown in FIGS. 9 and 10, the width of the main electrode portion 21a is set narrower than the widths of the lead portions 21b, 21c. In this case, the resistance of the second signal internal electrode 21 becomes relatively large, whereby the resistance of the resistance component RC can be set to a much larger value.

Figure 11:
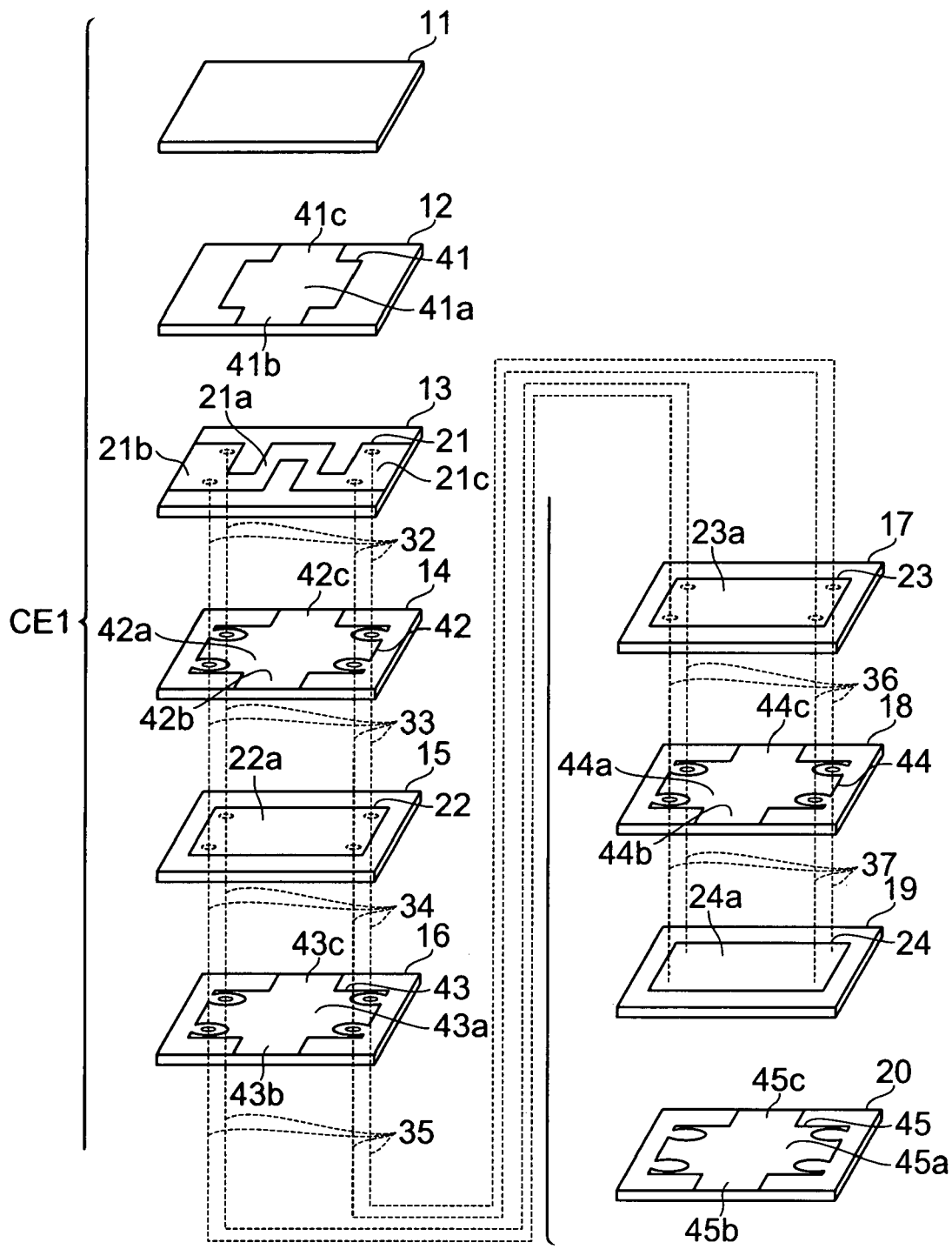
FIG. 11 is an exploded perspective view of still another modification example of the capacitor element body included in the multilayer filter according to the embodiment.
Figure 12:
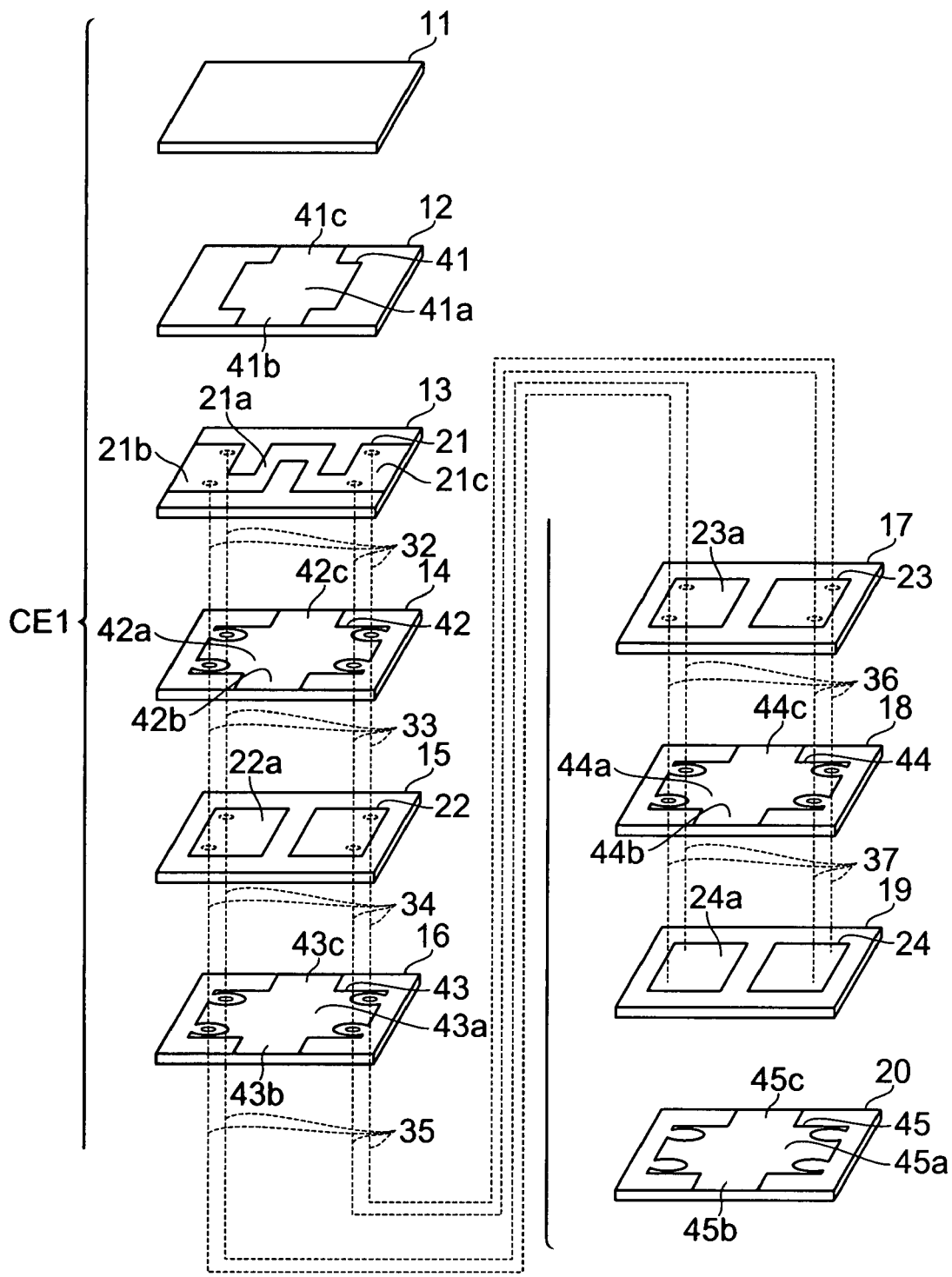
FIG. 12 is an exploded perspective view of still another modification example of the capacitor element body included in the multilayer filter according to the embodiment.

As shown in FIGS. 11 and 12, the second signal internal electrode 21 (main electrode portion 21a) may be formed in a meander shape. In this case, the path length of the second signal internal electrode 21 becomes longer, whereby the resistance of the second signal internal electrode 21 becomes relatively large. As a result, it is feasible to set the resistance of the resistance component RC to a much larger value.

In the capacitor element body CE1 of the multilayer filter shown in FIG. 12, each of the first signal internal electrodes 22-24 is divided into a plurality of segments (two segments in FIG. 12), and electrode portions of the respective segments are electrically connected through the through-hole conductors 32-37 to the second signal internal electrode 21.

The through-hole conductors 32-37 may be formed at positions outside the contour of the grounding internal electrodes 42-44 located on the respective insulator layers 14, 16, 18 with the through-hole conductors 33, 35, 37 therein, as shown in FIG. 8.

The number of signal terminal electrodes connected to the second signal internal electrode 21 does not have to be limited to that described in the above-described embodiment and modification examples, but may be, for example, three or more. The number of grounding terminal electrodes connected to the grounding internal electrodes 41-45 does not have to be limited to that described in the foregoing embodiment and modification examples, but may be, for example, one, or three or more.

The arrangement of the signal terminal electrodes 1, 2 and the grounding terminal electrodes 3, 4 does not have to be limited to that described in the foregoing embodiment and modification examples, but may be any arrangement as long as they are placed on the exterior of the capacitor element body CE1. Therefore, for example, the signal terminal electrodes 1, 2 do not always have to be opposed to each other in the opposing direction of the first and second end faces CE1a, CE1b of the capacitor element body CE1. Furthermore, for example, the grounding terminal electrodes 3, 4 do not always have to be opposed to each other in the opposing direction of the first and second side faces CE1c, CE1d of the capacitor element body CE1.

The number of second signal internal electrode 21 connected through the lead portions 21b, 21c to the signal terminal electrodes 1, 2, and the location thereof in the lamination direction are not limited to the number and location described in the aforementioned embodiment and modification examples. The second signal internal electrode 21 may also be arranged to be opposed to the first signal internal electrode with the insulator layer in between, instead of being opposed to the grounding internal electrode with the insulator layer in between.

The number of insulator layers between the first signal internal electrode 22-24 and the grounding internal electrode 42-45 should be at least one, but may be, for example, two or more. The number of insulator layers between the second signal internal electrode 21 and the grounding internal electrodes 41, 42 should be at least one, but may be, for example, two or more.

The lamination number of insulator layers 11-20 and the lamination number of internal electrodes 21-24, 41-45 are not limited to those described in the foregoing embodiment. The capacitor element body CE1 of the multilayer filter F1 may be laminated with further insulator layers, or with further insulator layers and internal electrodes alternately laminated.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer filter comprising:
a capacitor element body;
at least two signal terminal electrodes placed on an exterior of the capacitor element body; and
at least one grounding terminal electrode placed on the exterior of the capacitor element body;
wherein the capacitor element body has a plurality of laminated insulator layers, a first signal internal electrode and a grounding internal electrode arranged so as to be opposed to each other with at least one insulator layer out of the plurality of insulator layers in between, and a second signal internal electrode arranged so as to be opposed to the grounding internal electrode with at least one insulator layer out of the plurality of insulator layers in between;

wherein the second signal internal electrode is connected to the at least two signal terminal electrodes;

wherein the first signal internal electrode is connected through a through-hole conductor to only the second signal internal electrode, wherein the first signal electrode has a main electrode portion having a rectangular shape and opposed to the grounding internal electrode;

wherein the grounding internal electrode is connected to the at least one grounding terminal electrode; and wherein the grounding internal electrode is arranged between the first and second signal internal electrodes.

2. The multilayer filter according to claim 1, wherein the second signal internal electrode is of a meander shape.

\* \* \* \* \*